United States Patent
Akram et al.

(10) Patent No.: US 6,861,745 B2
(45) Date of Patent: Mar. 1, 2005

(54) METHOD AND APPARATUS FOR CONDUCTING HEAT IN A FLIP-CHIP ASSEMBLY

(75) Inventors: Salman Akram, Boise, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/055,298

(22) Filed: Jan. 23, 2002

(65) Prior Publication Data

US 2002/0195702 A1 Dec. 26, 2002

Related U.S. Application Data

(62) Division of application No. 09/885,615, filed on Jun. 20, 2001, now Pat. No. 6,541,303.

(51) Int. Cl.[7] .............................................. H01L 23/10
(52) U.S. Cl. ...................... 257/706; 257/707; 257/708; 257/778; 257/779; 257/780; 257/737; 257/738
(58) Field of Search .................. 257/706–708, 257/778–780, 737–738

(56) References Cited

U.S. PATENT DOCUMENTS

| | | | |
|---|---|---|---|
| 4,764,804 A | * | 8/1988 | Sahara et al. ............. 257/717 |
| 5,124,179 A | | 6/1992 | Garg et al. |
| 5,126,206 A | * | 6/1992 | Garg et al. ............. 428/408 |
| 5,354,717 A | | 10/1994 | Pollock et al. |
| 5,508,230 A | | 4/1996 | Anderson et al. |
| 5,817,540 A | | 10/1998 | Wark |
| 5,903,058 A | | 5/1999 | Akram |
| 6,036,809 A | | 3/2000 | Kelly et al. |
| 6,147,413 A | | 11/2000 | Farnworth |
| 6,287,893 B1 | | 9/2001 | Elenius et al. |
| 6,389,691 B1 | * | 5/2002 | Rinne et al. ............. 29/843 |

* cited by examiner

*Primary Examiner*—Luan Thai
(74) *Attorney, Agent, or Firm*—TraskBritt, PC

(57) ABSTRACT

A method and apparatus for thermally conducting heat from a semiconductor device, namely, a flip-chip assembly. In one embodiment, a heat sink, such as a diamond layer having openings therein, is provided over a surface of a semiconductor device. Conductive pads are formed in the openings to be partially contacting the diamond layer and to electrically communicate with the semiconductor device. The heat produced from the semiconductor device and thermally conducting through the conductive pads is thermally conducted to the heat sink or diamond layer and away from the interconnections, i.e., solder bump connections, between a semiconductor device and a carrier substrate in a flip-chip assembly. As a result, thermal fatigue is substantially prevented in a flip-chip assembly.

74 Claims, 7 Drawing Sheets

METHOD AND APPARATUS FOR CONDUCTING HEAT IN A FLIP-CHIP ASSEMBLY

CROSS-REFERENCE TO RELATED APPLICATION

This application is a divisional of application Ser. No. 09/1885,615, filed Jun. 20, 2001 now U.S. Pat. No. 6,541,303.

BACKGROUND OF THE INVENTION

1. Field of the Invention

The present invention relates generally to flip-chip semiconductor devices and, more specifically, the present invention relates to improved heat dissipation in flip-chip semiconductor devices.

2. State of the Art

Semiconductor devices inherently generate heat during operation which must be dissipated to maintain the semiconductor device at an acceptable operating temperature. As the operating speed of a semiconductor device increases, typically, the semiconductor device has increased power dissipation and increased heat generated. For example, high operating speed microprocessors tend to have higher power requirements and to generate more heat at the higher operating speeds.

Additional heat dissipation issues arise in the case where the semiconductor device is configured as a "flip-chip." In a flip-chip configuration, the surface of a semiconductor die which has an electronic device formed therein directly opposes a die-attach substrate. The semiconductor die is typically attached to the die-attach substrate only by conductive bumps which lead to the bonding pads of the semiconductor die. Typically, electrical traces printed on the die-attach substrate lead from the bumps to provide interconnection to other circuit components.

The described flip-chip configuration gives rise to heat dissipation problems because most of the heat generated by a semiconductor device is generated at the active surface of the semiconductor die. In the flip-chip configuration, the active surface of the semiconductor die is sandwiched against a die-attach substrate, which is typically a ceramic insulator, a relatively poor heat-sink, having the space between the semiconductor die and the substrate filled with an underfill material to increase the strength of the connection between the semiconductor die and the substrate as well as to help prevent environmental attack of the electrical circuitry and connections to the substrate. As a result, the majority of the heat generated by a flip-chip semiconductor die is not efficiently dissipated. As such, the conductive bumps provide an extremely small surface area through which the heat must be dissipated, resulting in undesirable localized "hot points or hot spots," which often result in thermal fatigue in the interconnections of the conductive bumps.

In an effort to prevent such localized hot points, U.S. Pat. No. 5,508,230 to Anderson et al. discloses a flip-chip assembly having improved heat dissipating capability. As shown in drawing FIGS. 1(a) and 1(b), the flip-chip semiconductor device assembly in the '230 Patent includes a diamond layer 16 over the active surface 14 of the semiconductor die 10 and a metalized pad 20 provided in a center portion over the top of the diamond layer 16. The solder bumps 22 are provided through openings 18 in the diamond layer 16. A die-attach substrate 12 is connected to the semiconductor die 10 so that the solder bumps 22 and the metalized pad 20 are directly contacting the die-attach substrate 12. In this manner, heat is dissipated across the diamond layer .16 and is drawn off the device into the metalized pad 20. Although the diamond layer 16 is an excellent conductor of heat, the heat may become trapped in the metalized pad 20, resulting in thermal fatigue between the semiconductor die 10 and substrate 12 since the metalized pad 20 abuts the substrate 12. Furthermore, the diamond layer 16 includes openings 18 for the solder bumps 22 to protrude therethrough, in which the solder bumps 22 have little, if any, contact with the diamond layer 16. This lack of structure contacting the solder bumps results in the inability to effectively draw heat from the solder bumps 22 or localized hot points. Thus, heat dissipating through the solder bumps 22 will cause thermal fatigue in the solder bump interconnections between the die 10 and substrate 12.

Therefore, it would be advantageous to provide a method and apparatus that transfer heat from a flip-chip assembly to limit the potential thermal fatigue to the semiconductor assembly.

SUMMARY OF THE INVENTION

The present invention relates to a method and apparatus for transferring heat from a flip-chip semiconductor device assembly to help limit and control any thermal fatigue of the flip-chip semiconductor device assembly. The present invention is directed to a method and apparatus for providing a heat sink that dissipates heat away from the semiconductor die of the assembly. The present invention includes a diamond layer overlying a surface of a semiconductor die for channeling heat from the semiconductor die in a semiconductor device assembly.

In one embodiment, the present invention includes a diamond layer deposited or formed on the active surface of a semiconductor die, the diamond layer having at least one opening therein. At least one bond pad formed on the active surface of the semiconductor die extends partially through the at least one opening in the diamond layer. According to the present invention, the diamond layer thermally conducts heat from the at least one bond pad of the semiconductor die being partially in contact therewith. Further, the diamond layer dissipates the heat away from the semiconductor die.

In another embodiment, the present invention includes a diamond layer having at least one opening or via therein deposited or formed over a surface, typically the active surface, of a semiconductor die. The diamond layer includes a trace formed therein for electrical communication between the semiconductor die and a contact pad formed in the opening or via in the diamond layer. In this embodiment, the diamond layer thermally conducts heat from the semiconductor die, the trace and the contact pad. In turn, the heat dissipates from the diamond layer.

In another embodiment, the present invention includes a semiconductor die having a surface, typically the active surface, with a first diamond layer, or film, deposited or formed thereon. Bond pads of the semiconductor die are exposed through the first diamond layer. A second diamond layer is formed over the first diamond layer having a passivation layer therebetween. A conductive trace is formed in the passivation layer to electrically communicate with the semiconductor die and a conductive pad provided in openings in the second diamond layer. According to the present invention, the conductive pad extends partially over and in contact with the second diamond layer to thermally conduct heat therefrom and, in addition, the first diamond layer directly contacts the active surface of the semiconductor die to thermally conduct heat therefrom. As a result, the present invention provides a method and apparatus for thermally conducting heat from a semiconductor device to prevent thermal fatigue in the interconnections therein.

BRIEF DESCRIPTION OF THE SEVERAL VIEWS OF THE DRAWINGS

The method and apparatus of the present invention will be more fully understood from the detailed description of the invention when taken in conjunction with the drawings, wherein.

DETAILED DESCRIPTION OF THE INVENTION

Embodiments of the present invention will be hereinafter described with reference to the accompanying drawings. It should be understood that the illustrations are not meant to be actual views of any particular apparatus and/or method, but are merely idealized representations which are employed to more clearly and fully depict the present invention than would otherwise be possible. Additionally, elements common between the figures retain the same numerical designation.

Figure 1A:
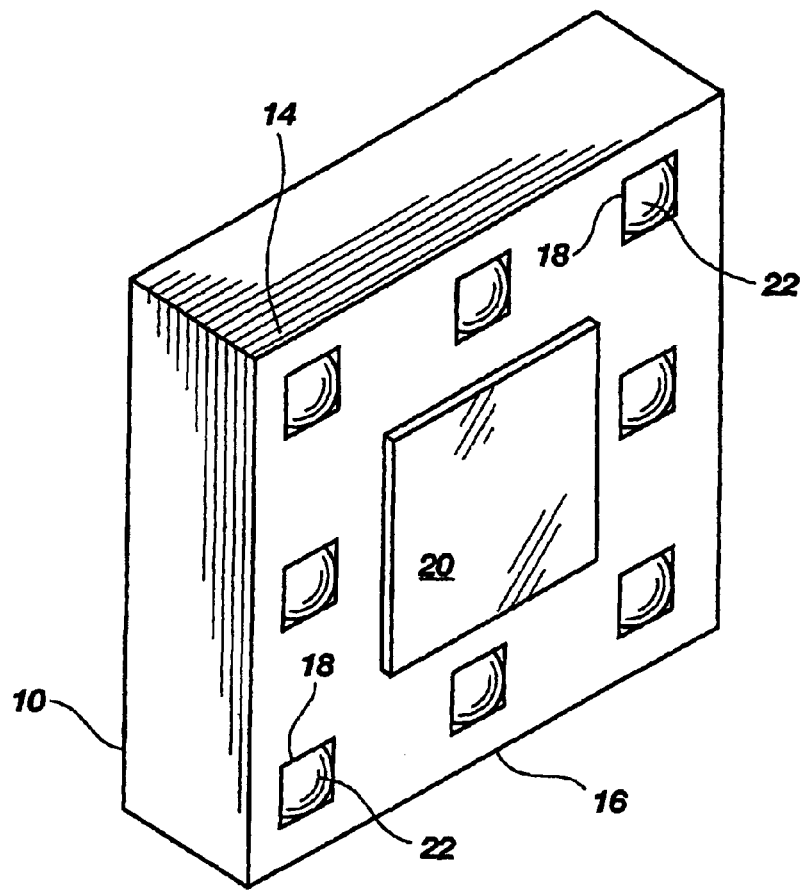
FIG. 1(a) is a perspective view of a conventional semiconductor die having a diamond layer over the active surface thereof.
Figure 1B:
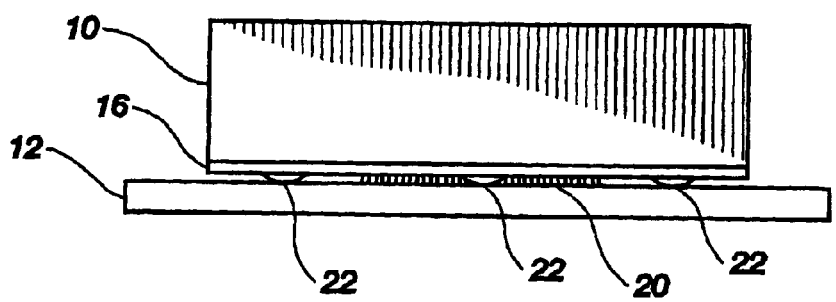
FIG. 1(b) is a side view of a conventional semiconductor die having a diamond layer thereon, depicting the semiconductor die being attached to a substrate.
Figure 2A:
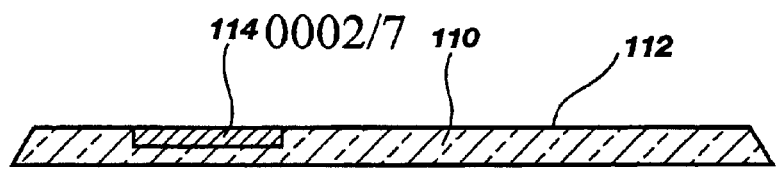
FIGS. 2(a)–2(i) are simplified partial cross-sectional views of a first embodiment, illustrating a method for repatterning the active surface of a semiconductor die to include a diamond layer thereon, in accordance with the present invention.

A method and apparatus of a first embodiment of the present invention are shown in drawing FIGS. 2(a) through 2(i). Illustrated in drawing FIG. 2(a) is a partial cross-sectional view of a substrate 110. The substrate 110 is preferably an individual semiconductor die (bare or packaged), but may be a wafer having a plurality of semiconductor dice thereon, or a portion or part of a wafer having a plurality of semiconductor dice thereon, or a carrier substrate, for a flip-chip semiconductor device packaging assembly. In this embodiment, the substrate 110, a bare semiconductor die, includes a substrate surface 112, or active surface, having a plurality of bond pads 114 (only one bond pad is shown for simplification) that is electrically connected to circuitry (not shown) or a contact pad (not shown) or another bond pad (not shown) on the substrate 110.

Figure 2B:
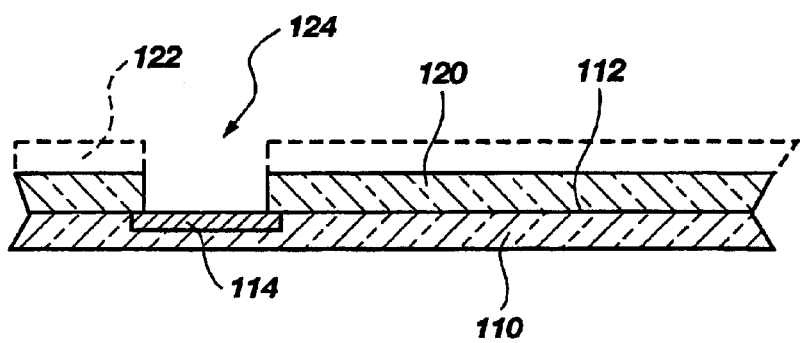

As shown in drawing FIG. 2(b), a first passivation layer 120 is deposited over the substrate surface 112 and the bond pads 114. The first passivation layer 120 may, for example, have a thickness of approximately 5,000 to 45,000 angstroms. The first passivation layer 120 may be any nonconductive material but is preferably a polymer such as a polyimide. The first passivation layer 120 is then coated with photoresist 122, masked, exposed, and etched to form a bond pad via 124 in order to expose the bond pad 114 thereunder. The remainder of the photoresist 122 mask is then removed to expose the first passivation layer 120.

Figure 2C:
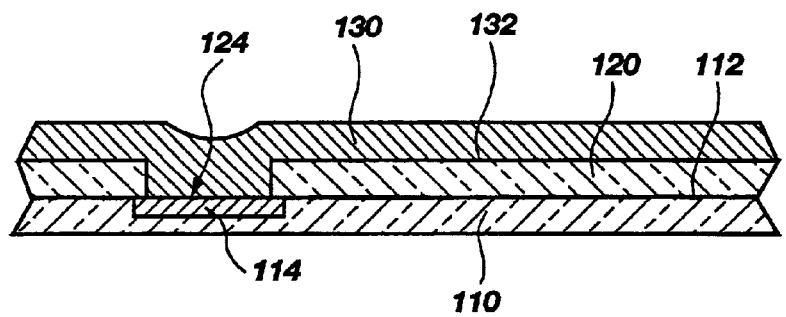
Figure 2D:
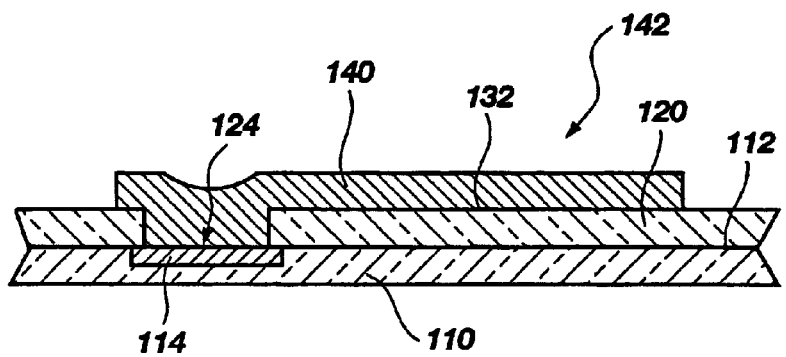

As shown in drawing FIG. 2(c), a conductive layer 130, preferably, but not limited to, an aluminum, copper, silver and/or alloys thereof, is applied over a surface 132 of the first passivation layer 120 and into the bond pad via 124. The conductive layer 130 is then coated with photoresist, masked, exposed and etched to form at least one conductive repattern trace 140, as shown in drawing FIG. 2(d). The etched conductive layer therefore provides a trace 140 that extends from the bond pad 114 to an alternative bond pad location 142. The trace 140 is etched to be substantially uniform in thickness over the portion extending over the first passivation layer 120 and may have a dimple in the portion of the trace 140 overlying the bond pad via 124.

Figure 2E:
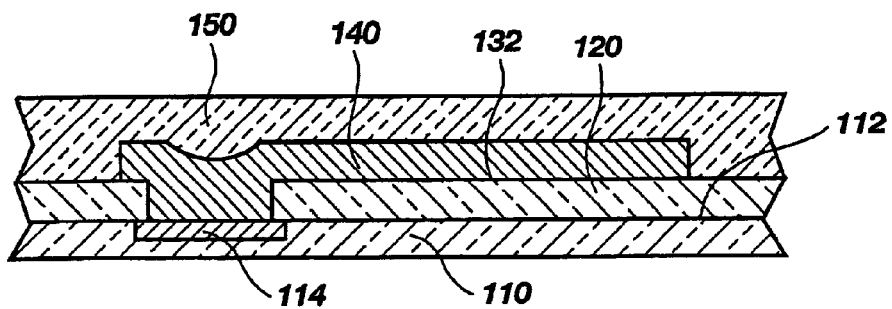

As shown in drawing FIG. 2(e), a second passivation layer 150, which may be a material similar to that of the first passivation layer 120, is provided over the trace 140. The second passivation layer 150 may, for example, be applied to a thickness of approximately 5,000 to 45,000 angstroms. The combined thickness of the first passivation layer 120 and the second passivation layer 150 may be approximately 50,000 angstroms. However, it should be noted that the thickness of the first and second passivation layers 120 and 150 are not limited to the ranges previously set forth, and neither is the combined thickness limited thereto.

Figure 2F:
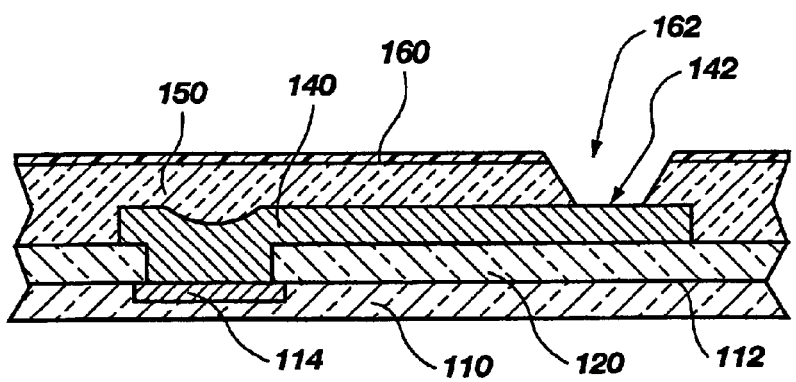

As shown in drawing FIG. 2(f), a diamond layer 160 is then provided over the second passivation layer 150. The diamond layer 160 may have a thickness of approximately 50 to 2000 angstroms; however, the invention is not limited to this range of thickness. The diamond layer 160 is then coated with photoresist, masked, exposed and etched to form at least one via 162 therethrough. The via 162 is etched into the diamond layer 160 and the second passivation layer 150 to expose the alternative bond pad location 142 of the trace 140. The diamond layer 160 may comprise a polycrystalline layer of diamond, an amorphous layer of diamond, a layer being a combination of polycrystalline diamond and amorphous diamond, a layer including diamond, either polycrystalline diamond or amorphous diamond or both polycrystalline diamond and amorphous diamond, and other elements, such as metals, silicates, rare earth elements, or other desired elements or contaminant elements, such as elements from the precursors forming the diamond layer, etc. In each instance herein, the diamond layer is referred to as a layer of diamond or a layer of substantially diamond. The layer of diamond may be deposited according to methods known in the industry, such as chemical deposition methods. For example, such chemical deposition methods for the deposition of the layer of diamond are set forth in U.S. Pat. Nos. 5,124,179 and 5,126,206.

Figure 2G:
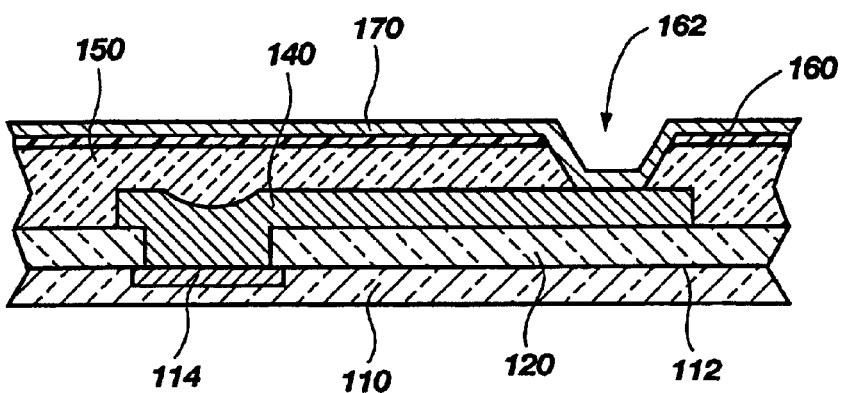
Figure 2H:
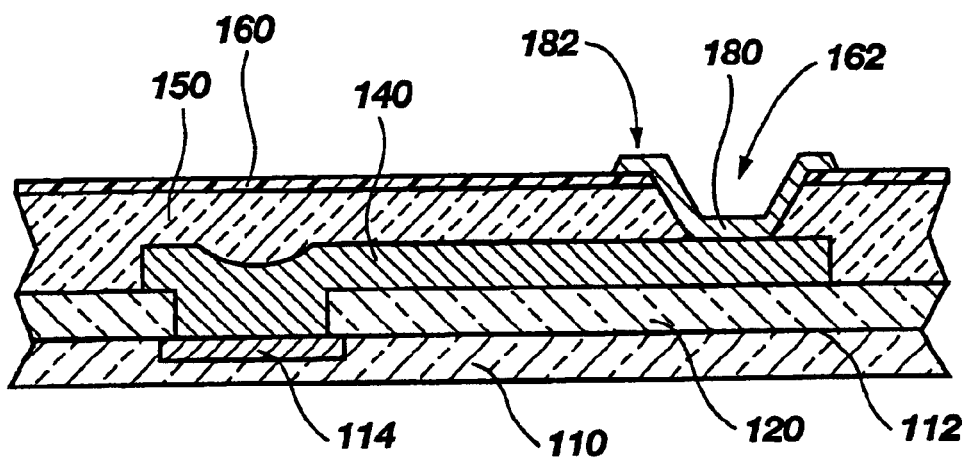

As shown in drawing FIG. 2(g), a metal layer 170 is formed over the diamond layer 160. The metal layer 170 may comprise an adhesion layer for adherence to one or more of the diamond layer 160, the second passivation layer 150, and the conductive trace 140. The metal layer 170 may also comprise a wettable layer or a layer with high wettability for solder reflow and bonding thereto, where the wettable layer may be on an opposite side or surface of the adhesion layer. The metal layer 170 is then coated with photoresist, masked, exposed and etched from the diamond layer, except for a portion of the metal layer 170 overlying the via 162 and adjacent thereto. As shown in drawing FIG. 2(h), the remaining portion of the metal layer 170 overlies the via 162 and portions of the diamond layer 160 adjacent to the via 162 so as to conform to the surface of the via 162 therein and the adjacent regions of the diamond layer 160 thereabove. These remaining portions of metal layer 170 are known in the art as an under bump metallurgy (UBM) structure 180. According to the present invention, the portions of the UBM structure 180 contacting the diamond layer 160 are referred to as a partial contact area 182. The partial contact area 182 may contact the diamond layer 160 in any manner, such as underlying the diamond layer 160 and/or abutting edge to edge; however, the partial contact area 182 is preferred to overlay the diamond layer 160 as shown in drawing FIG. 2(h).

As the UBM structure 180 is formed from the metal layer 170, the UBM structure also may comprise an adhesion layer and a solder wettable metal layer as previously set forth. The UBM structure 180 may be formed from the metal layer 170 as a laminate or composite by chemical vapor deposition (CVD), plasma enhanced CVD, or physical vapor deposition (PVD) such as sputtering, evaporation or otherwise, as known in the art. It should be noted that the present invention is not limited to any particular UMB metallurgy or to a multilayer UBM. The UBM structure 180 of the present invention may also be as described in U.S. Pat. No. 5,903,058, the disclosure of which is incorporated herein by this reference.

Figure 2I:
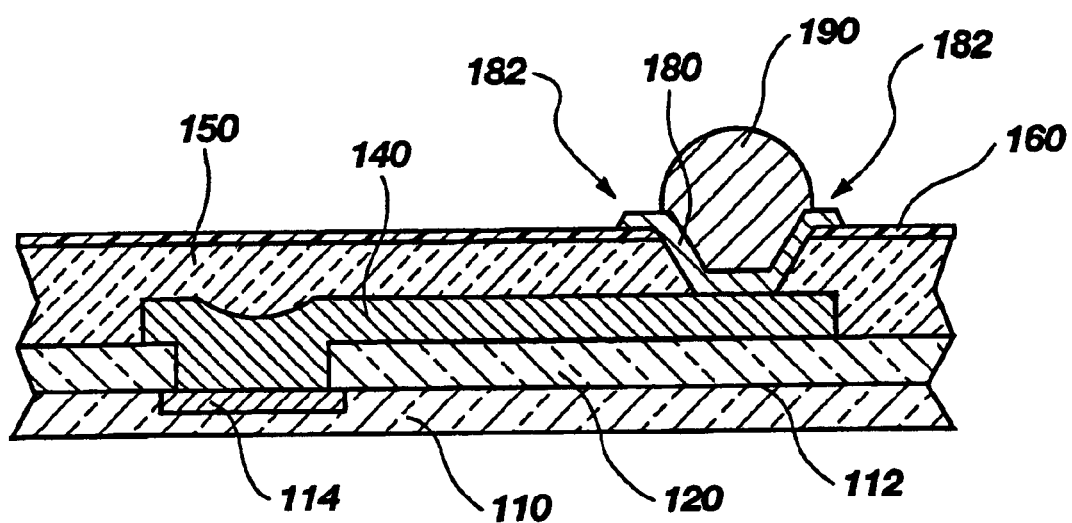

As shown in drawing FIG. 2(i), the UBM structure 180 may receive a corresponding conductive bump 190 or conductive interconnect, such as a conductive pillar, column and/or solder ball. The conductive bump may include but is not limited to any known conductive material or alloys thereof for attaching flip-chip assemblies, such as solder, lead, tin, copper, silver and/or gold and conductive polymers and/or conductive composites. The conductive bumps may also be layered with such materials and/or alloys thereof. The wetting layer in the UBM structure may directly contact the conductive bump and bond thereto after a reflow process at a predetermined temperature. The temperature may be determined by the conductive material employed in the conductive bump and the wetting layer as known to one skilled in the art. In this manner, the substrate 110 having the above-described repattern on the active surface thereof may be mounted to a carrier substrate 196 having the conductive bump 190 or the like therebetween, as shown in the flip-chip assembly 198 in drawing FIG. 3.

It has been determined in accordance with the present invention that diamond provides the best combination of thermal conductivity and electrical resistivity of available materials. Although the diamond layer 160 is preferred as a heat sink, other materials may be used such as silicon carbide, aluminum nitride, and/or aluminum oxide, which also provide high dielectric insulation but much less thermal conductivity than diamond. The only other materials providing similar thermal conductivity to that of diamond are electrically conductive metals such as copper and silver (diamond being approximately five times greater in thermal conductivity than copper), which are, of course, not useful in this particular aspect of the present invention due to their electrically conductive quality.

In the present invention, the methods used in depositing the diamond layer 160 typically include, but are not limited to, evaporation methods, laser-ablation methods, CVD methods, plasma enhanced CVD methods and PVD or sputtering methods. However, any method known to one of ordinary skill in the art may be employed in providing the diamond layer in the present invention. The diamond layer 160 provided may comprise crystal orientation of a single crystal or polycrystalline, or the diamond layer 160 may be amorphous. The diamond layer 160 may include but is not limited to other materials or layers such as hydrocarbons or organics, nitrogen, oxygen, etc. The diamond layer 160 may be doped with nitrogen and/or oxygen, or may include trace amounts of nitrogen and/or oxygen.

Figure 3:
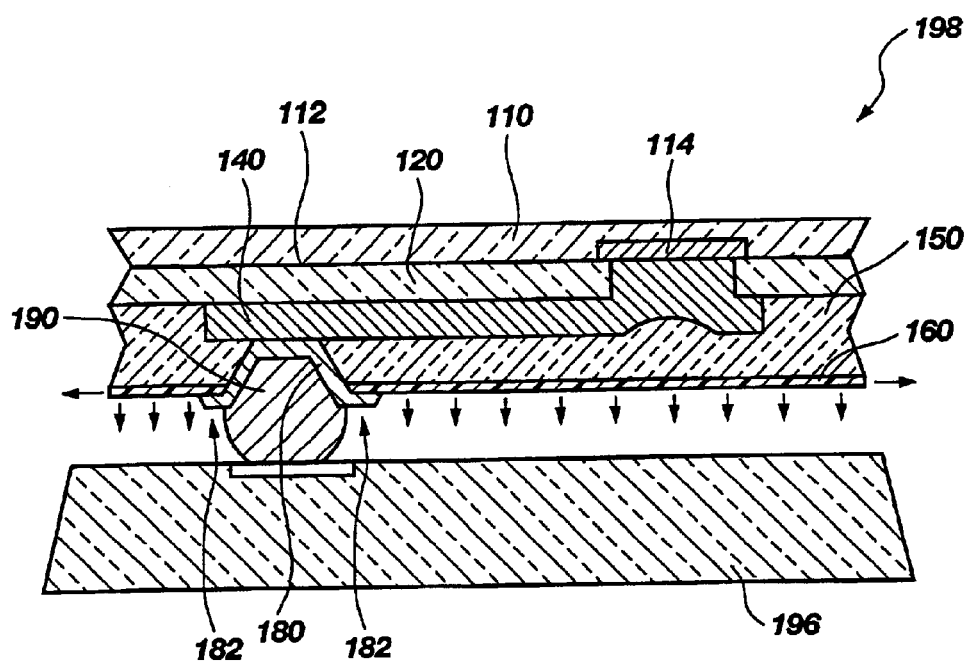
FIG. 3 is a simplified partial cross-sectional side view of a first embodiment, illustrating a semiconductor die having a diamond layer thereon attached to a carrier substrate, in accordance with the present invention.

Therefore, according to the present invention, as shown in drawing FIG. 3, diamond provides the best conduit or heat sink for channeling the heat from the flip-chip assembly 198, although other materials as previously set forth may be employed in the present invention. Therefore, it can be well appreciated that by having the UBM structure 180 partially contacting the diamond layer 160 at the partial contact area 182, the diamond layer 160 acts as a heat sink, thereby channeling the majority of the heat to directly transfer it from the substrate 110 to the heat sink or diamond layer 160.

Thus, the heat produced in the semiconductor device in the flip-chip semiconductor device assembly 198 is channeled from the circuitry (not shown) in the substrate 110 through the bond pads 114, the trace 140 and through the partial contact area 182 of the UBM structure 180. Since diamond is a much greater heat sink than any type of conductive material, the majority of the heat is channeled from the partial contact area 182 of the UBM structure 180 to the diamond layer 160, rather than to the conductive bump 190. As such, the heat is drawn substantially uniformly across the diamond layer to dissipate therefrom (illustrated by arrows in drawing FIG. 3) and, more importantly, the heat dissipates away from the substrate 110 itself. Although some of the heat will naturally dissipate through the conductive bump 190, this heat is at a minimum and the conventional problems of thermal fatigue within the flip-chip solder bump and the like interconnections, i.e., connection between the conductive bump 190 and the UBM structure 180 and/or the connection between the conductive bump 190 and the carrier substrate 196, will be reduced. Further, unlike other highly thermally conductive materials (i.e., copper, silver, etc.), diamond is a nonelectrically conductive material and, therefore, will not result in shorting-out the circuitry in the flip-chip semiconductor device assembly 198.

Figure 4:
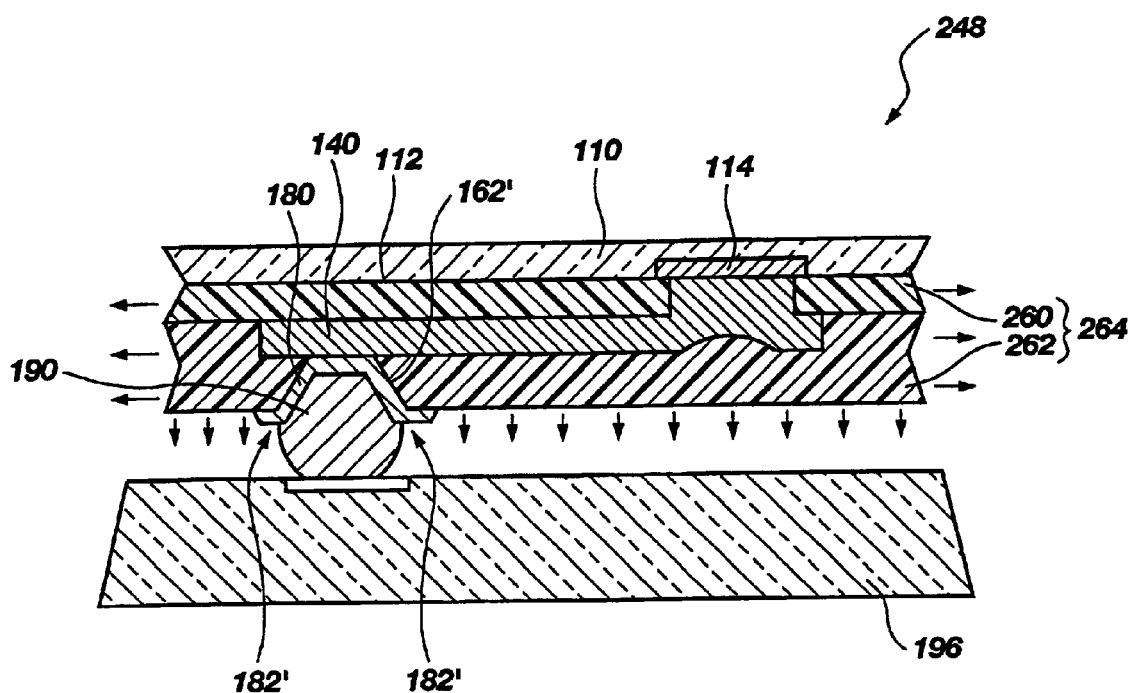
FIG. 4 is a simplified partial cross-sectional side view of a second embodiment, illustrating a semiconductor die having a thick diamond layer thereon attached to a carrier substrate, in accordance with the present invention.

A second embodiment of the present invention is illustrated in drawing FIG. 4, depicting a partial cross-sectional view of a substrate 110 such as a semiconductor die for a flip-chip semiconductor device packaging assembly 248. The second embodiment is similar to the first embodiment in every respect except that the first and second passivation layers 120 and 150 may be replaced with a first diamond layer 260 and a second diamond layer 262. As such, the first and second diamond layers 260 and 262 may be deposited by employing a similar method as previously discussed for the first and second passivation layers 120 and 150. The via 162', discussed in the first embodiment, may be etched into the second diamond layer 262, after which the UBM structure 180 may be formed over the via 162' similar to that which is set forth above. Thus, a thick diamond layer 264, comprising the first and second diamond layers 260 and 262, with the conductive trace 140 therein may be provided in the second embodiment. Alternatively, the thick diamond layer 264, as well as the conductive trace 140 extending therethrough and the UBM structure 180, may be formed and then assembled with the substrate 110.

The thick diamond layer 264 of the second embodiment may be desirable since diamond is not only a good dielectric insulator with excellent thermal conductivity but is a material which serves effectively as a passivation layer. As such, it is well appreciated that the thick diamond layer 264 thermally conducts heat from the elements it may have contact with, namely, the substrate 110, the bond pads 114, the conductive trace 140, and the UBM structure 180, as shown in drawing FIG. 4. Additionally, the arrangement of the second embodiment provides for the UBM structure 180 to include a partial contact area 182' with more surface area contacting diamond than that of the first embodiment due to the second diamond layer 262 being used as a passivation layer (that carries the conductive trace 140 and electrically separates the conductive trace 140 from substrate surface 112) as well as a thermal conductor. As a result, the portions of first and second diamond layers 260 and 262 that contact the conductive trace 140, along with the partial contact area 182', will provide for greater dissipation of heat from the substrate 110. Even more so, any heat flowing in the substrate 110, trace 140, and/or UBM structure 180 will be drawn therefrom to thermally conduct into the thick diamond layer 264 and dissipate therefrom (illustrated by arrows in drawing FIG. 4).

Figure 5:
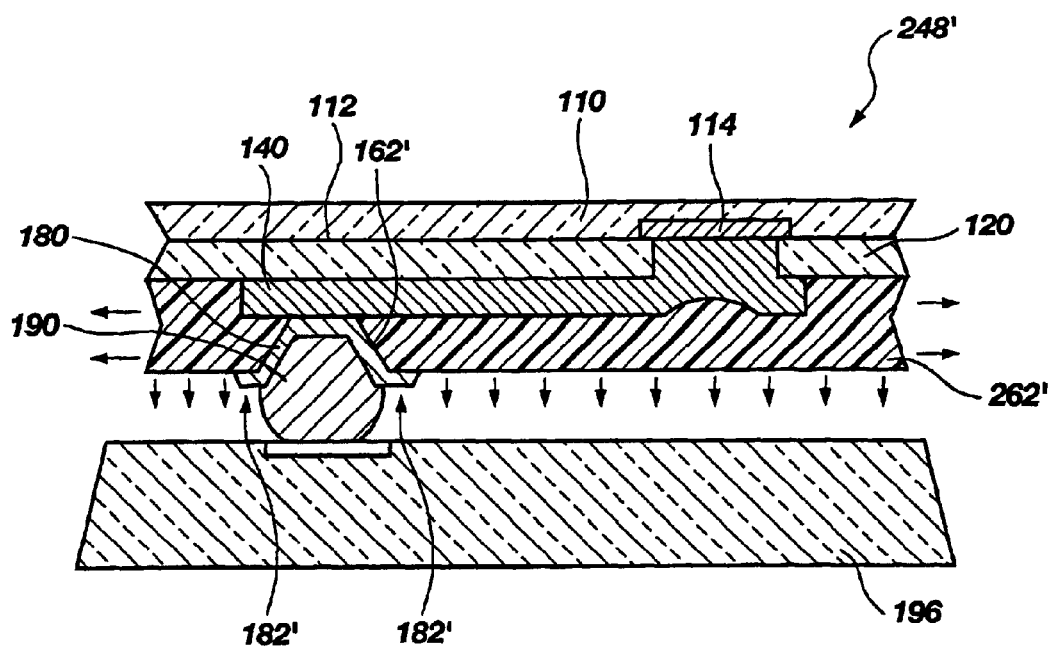
FIG. 5 is a simplified partial cross-sectional side view of an alternative to the second embodiment, illustrating a semiconductor die having an alternative diamond layer thereon attached to a carrier substrate, in accordance with the present invention.

An alternative to the second embodiment is illustrated in drawing FIG. 5, depicting a partial cross-sectional view of a substrate 110 such as a semiconductor die for a flip-chip semiconductor device packaging assembly 248'. This alternative is similar to the first embodiment in every respect except that the second passivation layer 150 may be replaced with a second diamond layer 262'. As such, the second diamond layer 262' may be deposited employing a similar method as previously discussed for the second passivation layer 150. The via 162', discussed in the first embodiment, may be etched into the second diamond layer 262', after which the UBM structure 180 may be formed over the via 162' similar to that which is set forth above. Thus, the second diamond layer 262', with the conductive trace 140 therein, may be provided as an alternative to the second embodiment. Alternatively, the second diamond layer 262', as well as the conductive trace 140 extending therethrough and the UBM structure 180, may be formed and then assembled with the substrate 110.

Figure 6:
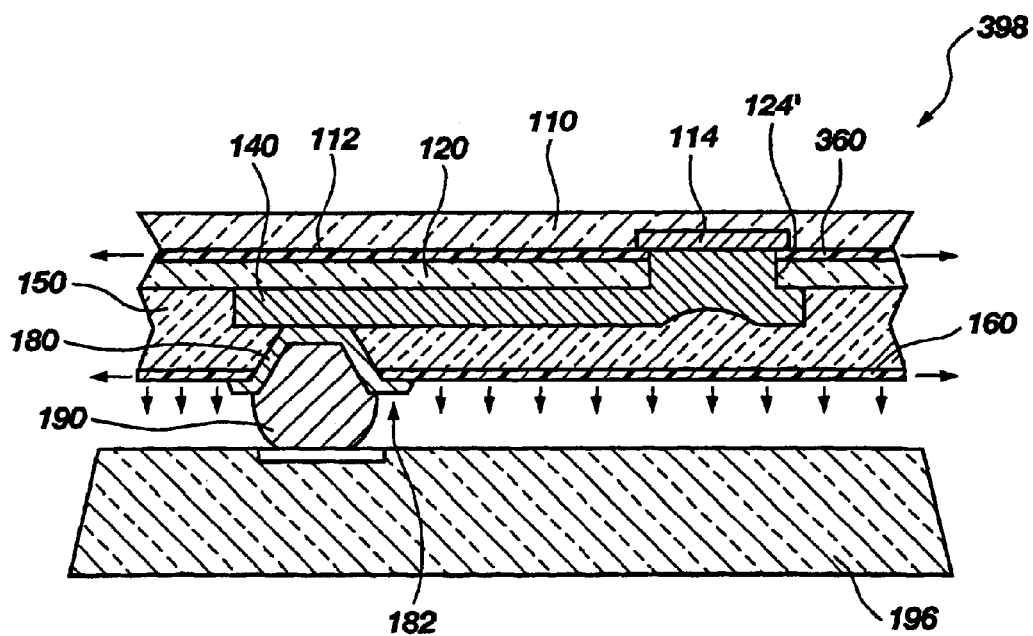
FIG. 6 is a simplified partial cross-sectional side view of a third embodiment, illustrating a semiconductor die having multiple separate diamond layers thereon attached to a carrier substrate, in accordance with the present invention.

A third embodiment of the present invention is illustrated in drawing FIG. 6, depicting a partial cross-sectional view of a substrate 110 such as a semiconductor die for a flip-chip semiconductor device packaging assembly 398. The third embodiment is similar to the first embodiment except for an additional diamond layer thereon. In particular, prior to depositing the first passivation layer 120, a diamond film 360 is deposited over at least the substrate surface 112. The diamond film 360 may have but is not limited to, for example, a thickness of about 50 to 2000 angstroms. The diamond film 360 may be deposited utilizing similar methods as previously discussed for the diamond layer in the first embodiment. After the first passivation layer 120 is deposited over the diamond film 360, the bond pad via 124' is formed by etching into the first passivation layer 120 and the diamond film 360 to expose the bond pad 114 thereunder. The process followed thereafter may be the same process steps as set forth previously in the first embodiment.

An important aspect of the present invention in the third embodiment is the diamond film 360 having direct contact with the substrate surface 112, a portion of the trace 140, and a portion of the bond pad 114. In this manner, heat will be additionally channeled (in addition to that which the first embodiment provides) from the substrate surface 112, trace 140 and bond pad 114 through the diamond film 360 to dissipate therefrom, thereby further preventing the heat from thermally fatiguing the interconnections of the flip-chip semiconductor device packaging assembly 398.

It should be noted that if the diamond layer or layers, as discussed in the above preferred embodiments, are provided on a substrate that comprises a wafer or multiple dice, it may be preferable to provide an etching process to the diamond layer or layers so that the wafer or multiple dice having a diamond layer or layers thereon may be easily diced into predetermined individual semiconductor dice or multiple semiconductor dice. Such an etching process may be incorporated in the present invention during or in addition to the process of providing the openings or vias in the diamond layer as, for example, shown in drawing FIG. 2(*f*).

Figure 7:
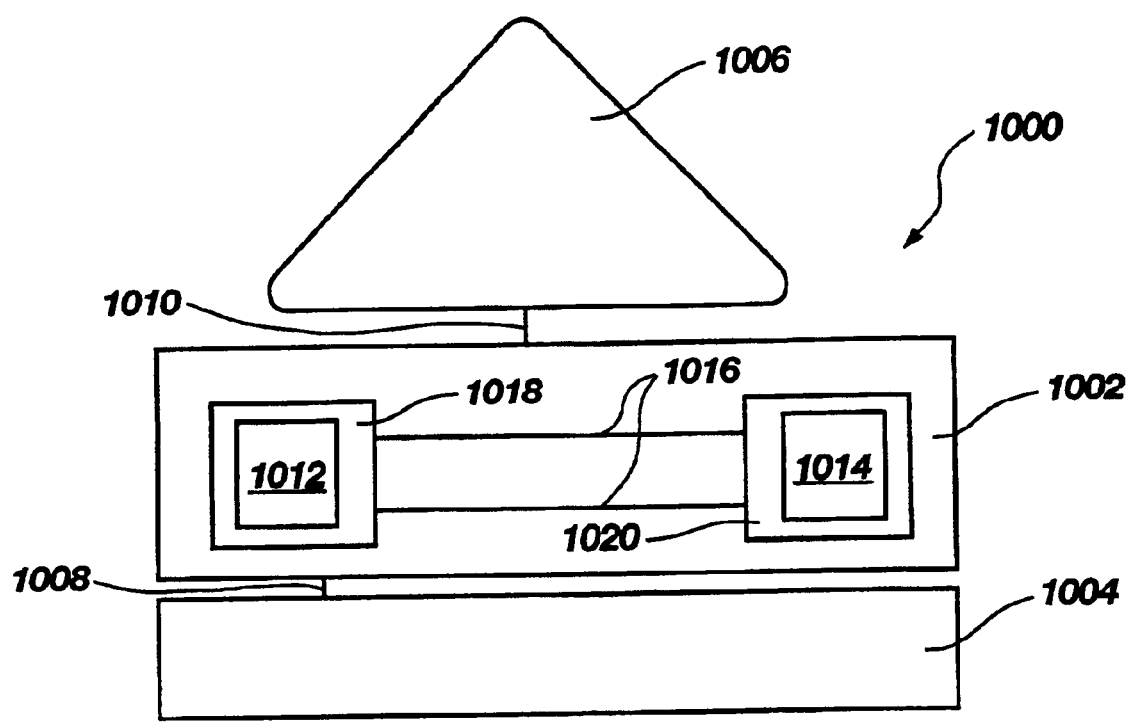
FIG. 7 is a diagram of a computer employing the present invention therein.

Referring to drawing FIG. 7, a computer 1000 is illustrated having a processing unit 1002, an input device 1004 connected to the processing unit by connection 1008, and an output device 1006 connected to the processing unit by connection 1010. The input device 1004 may be any suitable type input device, such as a keyboard. The output device 1006 may be any suitable type output device, such as a cathode ray type display or field emission display, etc. The processing unit 1002 includes a microprocessor 1012 and a semiconductor device 1014, such as a memory type semiconductor die, connected to each other by connections 1016. The microprocessor 1012 may be any suitable available digital type microprocessor. The semiconductor device 1014 may be any available suitable type memory device. The microprocessor 1012 may be mounted on a substrate 1018 while the semiconductor device 1014 may be mounted on a substrate 1020. For the purposes of the present invention described herein, either the microprocessor 1012 or the semiconductor device 1014 may include the present invention as part thereof.

While the present invention has been disclosed in terms of certain preferred embodiments and alternatives thereof, those of ordinary skill in the art will recognize and appreciate that the invention is not so limited. Additions, deletions and modifications to the disclosed embodiments may be effected without departing from the scope of the invention as claimed herein. For example, either the first diamond layer or the second diamond layer in the second embodiment may be replaced with a polyimide passivation layer. Similarly, features from one embodiment may be combined with those of another while remaining within the scope of the invention.

What is claimed is:

1. A semiconductor device assembly comprising:

a substrate having a surface, having a first passivation layer provided over at least a portion of said surface of said substrate, having a second passivation layer provided over at least a portion of said first passivation layer, having a layer comprising substantially diamond provided over at least over a portion of said second passivation layer having at least one aperture therein, and having at least one contact pad having a periphery, said at least one contact pad having at least a portion thereof extending at least partially over said layer comprising substantially diamond adjacent said at least one aperture therein and having at least a portion thereof extending through said at least one aperture in said layer comprising substantially diamond connected to at least one circuit on said substrate.

2. The assembly according to claim 1, wherein said periphery of said at least one contact pad covers portions of said layer comprising substantially diamond adjacent said at least one aperture therein.

3. The assembly according to claims 1, further comprising a conductive bump deposited on said at least one contact pad.

4. The assembly according to claim 1, wherein at least one of said first passivation layer and said second passivation layer has at least one trace having at least a portion thereof located on a portion of at least one of said first passivation layer and said second passivation layer to connect said substrate and said at least one contact pad.

5. The assembly according to claim 1, wherein said first passivation layer and said second passivation layer comprise a polyimide.

6. The assembly according to claim 1, wherein said layer comprising substantially diamond has a thickness of at least about 50 angstroms.

7. The assembly according to claim 1, wherein said layer comprising substantially diamond has a thickness of between about 50 and 2000 angstroms.

8. The assembly according to claim 1, wherein said layer comprising substantially diamond comprises substantially polycrystalline diamond.

9. The assembly according to claim 1, wherein said layer comprising substantially diamond comprises substantially amorphous diamond.

10. The assembly according to claim 1, wherein said layer comprising substantially diamond comprises polycrystalline diamond and amorphous diamond.

11. The assembly according to claim 1, wherein said layer comprising substantially diamond includes one of polycrystalline diamond, amorphous diamond and another material.

12. The assembly according to claim 1, wherein said layer comprising substantially diamond includes one of polycrystalline diamond, amorphous diamond and another material.

13. The assembly according to claim 1, wherein said substrate comprises:
a semiconductor die.

14. The assembly according to claim 1, wherein said substrate comprises:
a bare semiconductor die.

15. The assembly according to claim 1, wherein said substrate comprises:
a semiconductor wafer.

16. The assembly according to claim 1, wherein said substrate comprises:
a portion of a semiconductor wafer.

17. The assembly according to claim 1, wherein said substrate comprises:
a carrier substrate.

18. The assembly according to claim 1, wherein said substrate comprises:
a carrier substrate for a flip-chip semiconductor device assembly.

19. The assembly according to claim 1, wherein said substrate comprises:
a carrier substrate having a semiconductor die attached thereto.

20. The assembly according to claim 1, wherein said substrate comprises:
a carrier substrate having a semiconductor die adhesively attached thereto.

21. A semiconductor die assembly comprising:
a substrate having a surface, a passivation layer, said passivation layer provided over at least a portion of said surface of said substrate, a second passivation layer, said second passivation layer provided over said passivation layer, a layer including diamond having at least one aperture therein, said layer provided substantially over said second passivation layer, and at least one contact pad having at least a portion thereof extending at least partially over said layer and having a portion thereof extending at least into said at least one aperture in said layer.

22. The assembly according to claim 21, wherein said at least one contact pad has substantially a periphery thereof contacting said layer.

23. The assembly according to claim 21, further comprising:
a conductive bump located on said at least one contact pad.

24. The assembly according to claim 21, wherein at least one of said passivation layer and said second passivation layer carries at least one trace to electrically connect said substrate and said at least one contact pad.

25. The assembly according to claim 21, wherein said passivation layer and said second passivation layer comprise a polyimide.

26. The assembly according to claim 21, wherein said layer has a thickness of at least about 50 angstroms.

27. The assembly according to claim 21, wherein said layer has a thickness of between about 50 and 2000 angstroms.

28. A heat sink disposed on a substrate comprising:
a passivation layer disposed on at least a portion of a surface of a substrate;
a second passivation layer disposed on at least a portion of said passivation layer;
a layer including diamond disposed on at least a portion of said second passivation layer, said layer including at least one opening therein; and
at least one pad located on at least a portion of said surface of said substrate, said at least one pad having a portion thereof extending over at least a portion of said layer and having a portion thereof located in said at least one opening.

29. The heat sink according to claim 28, wherein said at least one pad has more than one portion thereof extending over said at least said portion of said layer.

30. The heat sink according to claim 28, wherein said at least one of said passivation layer and said second passivation layer has at least one trace connecting said substrate and said at least one pad.

31. A semiconductor device assembly comprising:
a semiconductor device having an active surface, having a passivation layer provided over at least a portion of said active surface of said semiconductor device, having a second passivation layer provided over at least a portion of said passivation layer, having a layer comprising substantially diamond provided over at least a portion of said second passivation layer having at least one aperture therein, and having at least one bond pad having a periphery located on said active surface, said at least one bond pad having at least a portion thereof extending at least partially over said layer comprising substantially diamond adjacent said at least one aperture therein and having at least a portion thereof extending at least through a portion of said at least one aperture in said layer comprising substantially diamond, said at least one bond pad connected to at least one circuit on said semiconductor device; and a substrate.

32. The assembly according to claim 31, wherein said periphery of said at least one bond pad covers portions of said layer adjacent said at least one aperture therein.

33. The assembly according to claim 31, further comprising:

a conductive bump deposited on said at least one bond pad.

34. The assembly according to claim 31, wherein at least one of said passivation layer and said second passivation layer has at least one trace having at least a portion thereof located on a portion of at least one of said passivation layer and said second passivation layer to connect said semiconductor device and said at least one bond pad.

35. The assembly according to claim 31, wherein said passivation layer and said second layer comprise a polyimide.

36. The assembly according to claim 31, wherein said layer comprising substantially diamond has a thickness of at least about 50 angstroms.

37. The assembly according to claim 31, wherein said layer comprising substantially diamond has a thickness of between about 50 and 2000 angstroms.

38. The assembly according to claim 31, wherein said layer comprising substantially diamond comprises substantially polycrystalline diamond.

39. The assembly according to claim 31, wherein said layer comprising substantially diamond comprises substantially amorphous diamond.

40. The assembly according to claim 31, wherein said layer comprising substantially diamond comprises polycrystalline diamond and amorphous diamond.

41. The assembly according to claim 31, wherein said layer comprising substantially diamond includes one of polycrystalline diamond, amorphous diamond, and another material.

42. The assembly according to claim 31, wherein said layer comprising substantially diamond includes polycrystalline diamond, amorphous diamond and another material.

43. The assembly according to claim 31, wherein said semiconductor device comprises:

a semiconductor die.

44. The assembly according to claim 43, wherein said substrate comprises:

a carrier substrate having said semiconductor die adhesively attached thereto.

45. The assembly according to claim 31, wherein said semiconductor device comprises:

a bare semiconductor die.

46. The assembly according to claim 31, wherein said semiconductor device comprises:

a semiconductor wafer.

47. The assembly according to claim 31, wherein said semiconductor device comprises:

a portion of a semiconductor wafer.

48. The assembly according to claim 31, wherein said semiconductor device comprises:

a flip-chip semiconductor die.

49. The assembly according to claim 31, wherein said substrate comprises:

a carrier substrate for a flip-chip semiconductor device assembly.

50. The assembly according to claim 31, wherein said substrate comprises:

a carrier substrate having a semiconductor die attached thereto.

51. A semiconductor die assembly comprising:

a semiconductor die having an active surface, a passivation layer, said passivation layer provided substantially over a portion of said active surface of said semiconductor device, a second passivation layer, said second passivation layer provided substantially over a portion of said passivation layer, a layer having at least one aperture therein, said layer including diamond provided substantially over a portion of said second passivation layer, and at least one bond pad having at least a portion thereof extending at least partially over said layer and having a portion thereof extending at least into said at least one aperture in said layer; and a substrate having said semiconductor die attached thereto.

52. The assembly according to claim 51, wherein said at least one bond pad has substantially a periphery thereof contacting said layer.

53. The assembly according to claim 51, further comprising:

a conductive bump located on said at least one bond pad.

54. The assembly according to claim 51, wherein at least one of said passivation layer and said second passivation layer has at least one trace connecting said semiconductor die and said at least one bond pad.

55. The assembly according to claim 51, wherein said passivation layer and said second passivation layer comprise a polyimide.

56. The assembly according to claim 51, wherein said layer has a thickness of at least about 50 angstroms.

57. The assembly according to claim 51, wherein said layer has a thickness of between about 50 and 2000 angstroms.

58. A heat sink disposed on a semiconductor device comprising:

a passivation layer disposed on at least a portion of an active surface of a semiconductor device, a second passivation layer disposed on at least a portion of said passivation layer, a layer including diamond disposed on at least a portion of said second passivation layer, said layer including at least one opening therein; and at least on bond pad located on at least a portion of said active surface of said semiconductor device, said at least one bond pad having a portion thereof extending over at least a portion of said layer and having another portion thereof located in said at least one opening.

59. The heat sink according to claim 58, wherein said at least one bond pad has more than one portion thereof extending over said at least a portion of said layer.

60. The heat sink according to claim 58, wherein at least one of said passivation layer and said second passivation layer has at least on trace connecting said semiconductor device and said at least one bond pad.

61. A semiconductor die comprising:

a substrate having a surface, at least one circuit located on said substrate, a passivation layer provided over at least a portion of said surface of said substrate, a second passivation layer provided over at least a portion of said passivation layer, a layer including diamond provided over at least a portion of said second passivation layer having at least one aperture therein, and having at least one contact pad having a periphery, said at least one contact pad having at least a portion thereof extending at least partially over said layer adjacent said at least one aperture therein and having at least a portion thereof extending through said at least one aperture in said layer, said at least one contact pad connected to said at least one circuit on said substrate.

62. The semiconductor die according to claim 61, wherein said periphery of said at least one contact pad covers portions of said layer adjacent said at least one aperture therein.

63. The semiconductor die according to claim 61, further comprising:
   a conductive bump deposited on said at least one contact pad.

64. The semiconductor die according to claim 61, wherein at least one of said passivation layer and said second passivation layer has at least one trace having at least a portion thereof located on a portion of at least one of said passivation layer and said second passivation layer to connect said substrate and said at least one contact pad.

65. The semiconductor die according to claim 61, wherein said passivation layer and said second passivation layer comprise a polyimide.

66. The semiconductor die according to claim 61, wherein said layer has a thickness of at least about 50 angstroms.

67. The semiconductor die according to claim 61, wherein said layer has a thickness of between about 50 and 2000 angstroms.

68. The semiconductor die according to claim 61, wherein said layer comprises substantially polycrystalline diamond.

69. The semiconductor die according to claim 61, wherein said layer comprises substantially amorphous diamond.

70. The semiconductor die according to claim 61, wherein said layer comprises polycrystalline diamond and amorphous diamond.

71. The semiconductor die according to claim 61, wherein
   said layer includes one of polycrystalline diamond, amorphous diamond and another material.

72. The semiconductor die according to claim 61, wherein
   said layer includes polycrystalline diamond, amorphous diamond and another material.

73. The semiconductor die according to claim 61, wherein said substrate comprises:
   a semiconductor wafer.

74. The semiconductor die according to claim 61, wherein said substrate comprises:
   a portion of a semiconductor wafer.

* * * * *

UNITED STATES PATENT AND TRADEMARK OFFICE
CERTIFICATE OF CORRECTION

| | | |
|---|---|---|
| PATENT NO. | : 6,861,745 B2 | Page 1 of 2 |
| APPLICATION NO. | : 10/055298 | |
| DATED | : March 1, 2005 | |
| INVENTOR(S) | : Salman Akram and Alan G. Wood | |

It is certified that error appears in the above-identified patent and that said Letters Patent is hereby corrected as shown below:

In the drawings:
        In FIG. 2(a),        delete "0002/7" located directly next to reference numeral "114"

Delete FIG. 2(a) and replace FIG. 2(a) with the following amended figure:

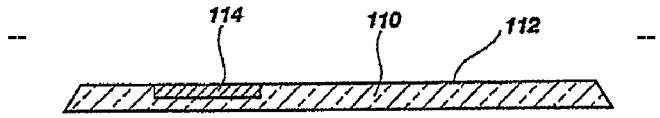

Fig. 2(a)

In the specification:
    COLUMN 2, LINE 4, change ".16" to --16--
    COLUMN 7, LINE 11, change "beat" to --heat--

In the claims:
CLAIM 3, COLUMN 9, LINE 5, change "claims 1" to --claim 1--
CLAIM 12, COLUMN 9, LINE 34-36, delete "12. The assembly according to claim 1, wherein said layer comprising substantially diamond includes one of polycrystalline diamond, amorphous diamond and another material." and insert --12. The assembly according to claim 1, wherein said layer comprising substantially diamond includes polycrystalline diamond, amorphous diamond and another material.--
CLAIM 58, COLUMN 12, LINE 46, change "at least on bond pad" to --at least one bond pad--

UNITED STATES PATENT AND TRADEMARK OFFICE
CERTIFICATE OF CORRECTION

PATENT NO. : 6,861,745 B2
APPLICATION NO. : 10/055298
DATED : March 1, 2005
INVENTOR(S) : Salman Akram and Alan G. Wood It is certified that error appears in the above-identified patent and that said Letters Patent is hereby corrected as shown below:

In the claims (cont'd):
CLAIM 60, COLUMN 12, LINE 56, change "at least on trace" to --at least one trace--

Signed and Sealed this

Twenty-seventh Day of November, 2007

JON W. DUDAS
*Director of the United States Patent and Trademark Office*